United States Patent
Inumiya et al.

(10) Patent No.: US 8,071,447 B2
(45) Date of Patent: Dec. 6, 2011

(54) SEMICONDUCTOR DEVICE MANUFACTURING METHOD

(75) Inventors: Seiji Inumiya, Yokohama (JP); Tomonori Aoyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/704,315

(22) Filed: Feb. 11, 2010

(65) Prior Publication Data

US 2010/0203704 A1 Aug. 12, 2010

(30) Foreign Application Priority Data

Feb. 12, 2009 (JP) .................. 2009-029587

(51) Int. Cl.
*H01L 21/336* (2006.01)

(52) U.S. Cl. ........ 438/261; 438/164; 438/763; 438/785; 257/E21.28; 257/E21.625

(58) Field of Classification Search .................. 438/223; 257/E21.051, E21.056, E21.06, E21.177, 257/E21.283, E21.4, E21.457
See application file for complete search history.

(56) References Cited

U.S. PATENT DOCUMENTS

| | | | | |
|---|---|---|---|---|
| 2006/0177997 A1* | 8/2006 | Lin et al. | .................. | 438/584 |
| 2008/0220582 A1* | 9/2008 | Yagishita et al. | ............. | 438/296 |
| 2009/0114996 A1 | 5/2009 | Inumiya et al. | | |

FOREIGN PATENT DOCUMENTS

| | | |
|---|---|---|
| JP | 2006-339514 | 12/2006 |
| JP | 2008-72001 | 3/2008 |

OTHER PUBLICATIONS

Suzuki, M. et al., "Ultra-Thin (EOT=3Å) and Low Leakage Dielectrics of La-Alminate Directly on Si Substrate Fabricated by High Temperature Deposition," IEDM Tech. Dig., pp. 445-448, (Dec. 2005).

Kubicek, S. et al., "Strain Enhanced Low-$V_T$ CMOS Featuring La/Al-doped HfSiO/TaC and 10ps Invertor Delay," 2008 Symposium on VLSI Technology Digest of Technical Papers, pp. 130-131, ( Jun. 2008).

Tatsumura, K. et al., "Intrinsic Correlation between Mobility Reduction and $V_t$ shift due to Interface Dipole Modulation in HfsiON/SiO$_2$ stack by La or Al addition," IEDM Tech. Dig., pp. 25-28, (Dec. 2008).

Suzuki, M. et al., "Lanthanum Aluminate Gate Dielectric Technology with Direct Interface," Toshiba Corporation Review, vol. 62, No. 2, pp. 37-41, (2007).

* cited by examiner

*Primary Examiner* — Cheung Lee
(74) *Attorney, Agent, or Firm* — Finnegan, Henderson, Farabow, Garrett & Dunner, L.L.P.

(57) ABSTRACT

A semiconductor device manufacturing method includes removing an insulating film on a semiconductor substrate by etching and subsequently oxidizing a surface of the substrate by using a liquid oxidation agent without exposing this surface to an atmosphere, thereby forming a first insulating film containing an oxide of a constituent element of the substrate on the surface of the substrate; forming a second insulating film containing an aluminum oxide on the first insulating film; forming a third insulating film containing a rare earth oxide on the second insulating film; forming a high-k insulating film on the third insulating film; introducing nitrogen into the high-k insulating film to thereby make it a fourth insulating film; and conducting heat treatment to change the first through third insulating films into an insulating film made of a mixture containing aluminum, a rare earth element, the constituent element of the substrate, and oxygen.

19 Claims, 13 Drawing Sheets

SEMICONDUCTOR DEVICE MANUFACTURING METHOD

CROSS REFERENCE TO RELATED APPLICATIONS

This application is based upon and claims the benefit of priority from prior Japanese Patent Application No. 2009-29587, filed on Feb. 12, 2009, the entire contents of which are incorporated herein by reference.

BACKGROUND OF THE INVENTION

1. Field of the Invention

The present invention relates to a method for manufacturing semiconductor devices and, more specifically to, a method for manufacturing complementary MISFETs having a gate insulating film made of a high-dielectric constant material.

2. Related Art

In recent years, in a semiconductor device including metal-insulator-semiconductor field effect transistors (MISFETs), the film thickness of gate insulating films has been becoming thinner as gate length has become shorter. This trend increases a leakage current due to the quantum tunneling effect, thus suppressing dissipation power of the MISFET from being lowered.

Conventionally, as the gate insulating film, a silicon oxide film ($SiO_2$) and a silicon oxy-nitride film (SiON) have been used. However, by using these materials, the gate insulating film cannot easily be thinned further while suppressing the leakage current. The thinning of the gate insulating film is now up against a physical limit.

To satisfy both of suppression of the leakage current and thinning of the effective gate insulating film thickness (also referred to as effective oxide film thickness, film thickness calculated as $SiO_2$, or equivalent oxide thickness (EOT)), a so-called high-dielectric constant gate insulating film technology is proposed which uses gate insulating films made of a high-dielectric constant material (hereinafter referred to as high-k material) (see, for example, Japanese Patent Application Laid-Open No. 2008-72001). As the high-k materials, hafnium-based oxides have been discussed such as hafnium oxide ($HfO_2$) and nitrided hafnium silicate (HfSiON).

However, in the case of forming a high-k material as the gate insulating film on a silicon substrate, it is impossible to avoid a low-dielectric constant layer (interface transition layer) mainly made of silicon oxide occurring on the interface between the gate insulating film and the silicon boundary. Therefore, it is difficult to form a gate insulating film having an extremely small effective oxide film thickness.

To solve this problem, a method is proposed for realizing an extremely small effective film thickness of the gate insulating film necessary in the next generation semiconductor devices (see, for example, Toshiba Corporation Review Vol. 62, No. 2 (2007), pp. 37-41). By this method, a film made of a high-k material (hereinafter referred to as high-k film) is directly junctioned to the surface of a silicon substrate. Other methods may be available for forming a high-k film ($HfO_2$) having an extremely thin HfSiOx interface layer between itself and a silicon substrate on the silicon substrate. Those methods will prevent formation of the aforesaid interface transition layer mainly made of a silicon oxide film.

SUMMARY OF THE INVENTION

According to a first aspect of the present invention, there is provided a semiconductor device manufacturing method including:

removing an insulating film on a semiconductor substrate by using wet etching and subsequently oxidizing a surface of the semiconductor substrate by using a liquid oxidation agent without exposing this surface to an atmosphere, thereby forming a first insulating film containing an oxide of a constituent element of the semiconductor substrate on the surface of the semiconductor substrate;

forming a second insulating film containing an aluminum oxide on the first insulating film;

forming a third insulating film containing a rare earth oxide on the second insulating film;

forming a high-k insulating film containing at least one of hafnium and zirconium on the third insulating film;

introducing nitrogen into the high-k insulating film to thereby make the high-k insulating film a fourth insulating film; and subsequently conducting heat treatment to thereby change the first, second and third insulating films into a insulating film made of a mixture containing aluminum, a rare earth element, the constituent element of the semiconductor substrate, and oxygen.

According to a second aspect of the present invention, there is provided a method for manufacturing semiconductor devices having a complementary MISFET combining an n-type MISFET and a p-type MISFET, the method including:

forming on a semiconductor substrate an device isolation insulating film that electrically isolates a first region on the semiconductor substrate in which the n-type MISFET is to be formed and a second region on the semiconductor substrate in which the p-type MISFET is to be formed;

covering the semiconductor substrate with a sacrificial film;

covering the sacrificial film in the second region with a first photo resist and then implanting p-type impurity ions into it to thereby form a p-well in the first region;

covering the sacrificial film in the first region with a second photo resist and then implanting n-type impurity ions into it to thereby form an n-well in the second region;

removing the sacrificial film on the semiconductor substrate by using wet etching and subsequently oxidizing a surface of the semiconductor substrate by using a liquid oxidation agent without exposing this surface to an atmosphere, thereby forming a first insulating film containing an oxide of a constituent element of the semiconductor substrate on the surface of the semiconductor substrate in the first and second regions;

forming a second insulating film containing an aluminum oxide on the first insulating film;

forming a third insulating film containing a rare earth oxide on the second insulating film;

forming a high-k insulating film containing at least one of hafnium and zirconium on the third insulating film;

introducing nitrogen into the high-k insulating film to thereby make the high-k insulating film a fourth insulating film; and subsequently conducting heat treatment to thereby stabilize the nitrogen in the fourth insulating film and also change the first, second and third insulating films into a insulating film made of a mixture containing aluminum, a rare earth element, the constituent element of the semiconductor substrate, and oxygen.

According to a third aspect of the present invention, there is provided a semiconductor device manufacturing method including:

depositing an device isolation insulating film in the element separation trench and then removing the device isolation insulating film by using wet etching until it has a predetermined thickness and subsequently oxidizing a side surface of the fin by using a liquid oxidation agent without exposing this side surface to an atmosphere, thereby forming a first insulating film containing an oxide of a constituent element of the semiconductor substrate on the side surface of the fin;

forming a second insulating film containing an aluminum oxide on the first insulating film;

forming a third insulating film containing a rare earth oxide on the second insulating film;

forming a high-k insulating film containing at least one of hafnium and zirconium on the third insulating film;

introducing nitrogen into the high-k insulating film to thereby make the high-k insulating film a fourth insulating film; and subsequently conducting heat treatment to thereby stabilize the nitrogen in the fourth insulating film and also change the first, second and third insulating films into a insulating film made of a mixture containing aluminum, a rare earth element, the constituent element of the semiconductor substrate, and oxygen.

DETAILED DESCRIPTION OF THE INVENTION

Figure 1A:
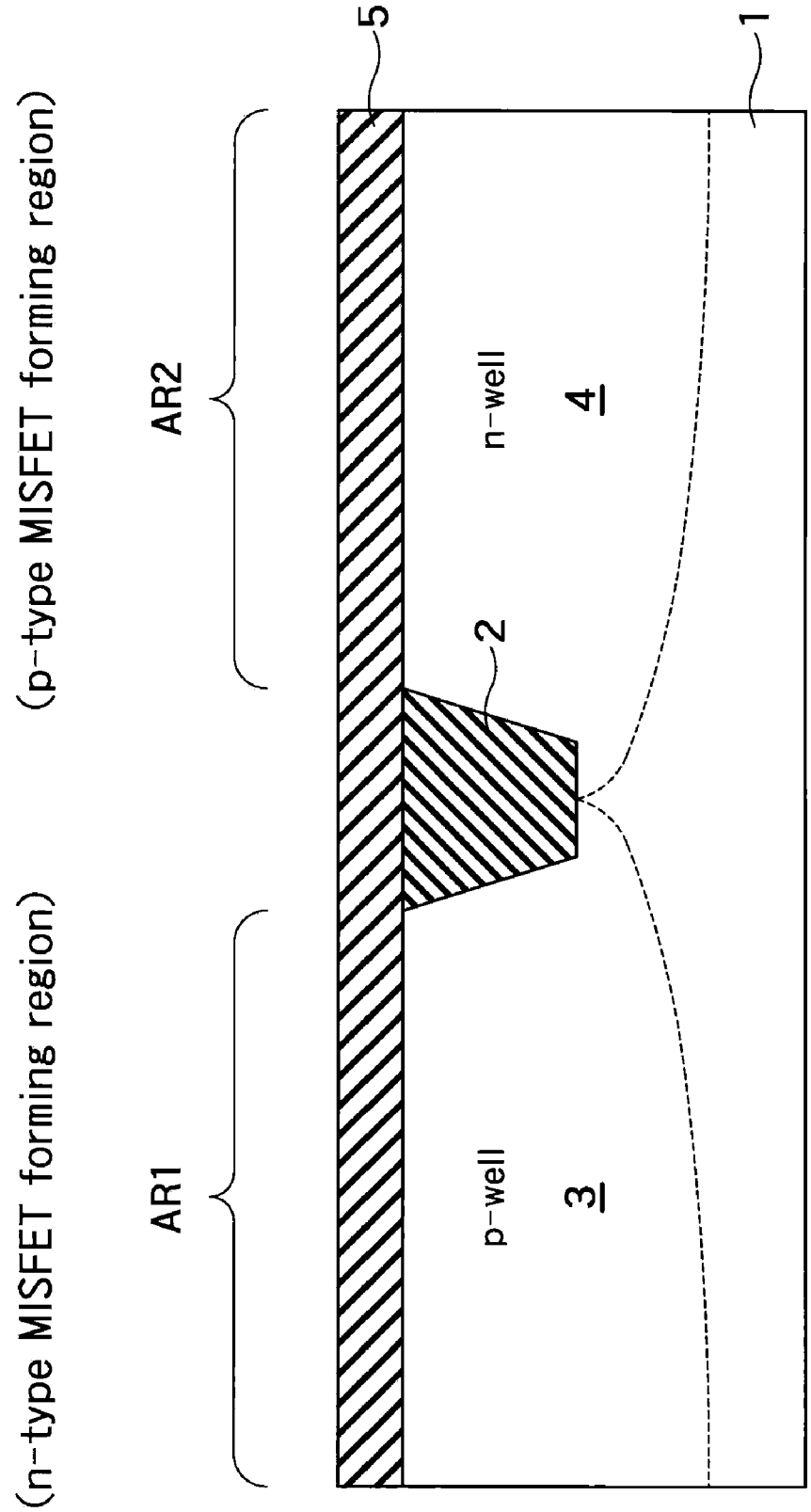
FIG. 1A is a cross-sectional view showing a process of manufacturing a semiconductor device according to a first embodiment.

Before the description of embodiments of the present invention, a description will be given of the background to the present inventors developing the present invention.

In a high-k film formation method that can avoid an interface transition layer from being formed between a silicon substrate and a high-k gate insulating film, the high-k film is formed on a hydrophobic surface of the silicon substrate. Accordingly, it is difficult to apply this high-k film formation method to actual LSI manufacturing processes in which a multi-oxide process is required. The multi-oxide process here refers to a process of forming a plurality of types of MISFETs having different insulating film thicknesses on one substrate.

A description will be given of a specific example of the multi-oxide process as follows. A method will be described for utilizing the multi-oxide process to thereby form a first MISFET and a second MISFET that has a thicker gate insulating film than the first MISFET.

First, a silicon oxide film to provide part of the gate insulating film of the second MISFET in a region in which the first and second MISFETs are to be formed. Subsequently, the silicon oxide film of a region in which the first MISFET is to be formed is etched off using, for example, an aqueous solution of hydrofluoric acid. Subsequently, a high-k film is formed in the region in which the first MISFET is to be formed and on the silicon oxide film in the region in which the second MISFET is to be formed respectively.

As can be seen from the description of this process, the film thickness of the gate insulating film of the first MISFET is the same as that of the high-k film, and the film thickness of the gate insulating film of the second MISFET is a sum of that of the silicon oxide film and that of the high-k film.

One of problems in the multi-oxide process is that a defect referred to as a watermark appears on a hydrophobic surface of the silicon substrate, if this silicon substrate is exposed to an atmosphere when the silicon oxide film is etched off in the region in which the first MISFET is to be formed. The watermark is a crater-shaped silicon hydrate remaining on the silicon substrate and induces defects in the gate insulating film formed on the silicon substrate, thus deteriorating properties of the MISFETs.

Thus, it is difficult to apply this method of forming a high-k film on the surface of a hydrophobic silicon substrate to the multi-oxide process. To describe it more specifically in the multi-oxide process, a watermark appears on the surface of a silicon substrate if this silicon substrate is exposed to an atmosphere to be dried after the silicon oxide film formed in a region to form the first MISFET therein is etched off, thus deteriorating a yield ratio.

Further, another method for forming a high-k gate insulating film is proposed, as follows. That is, in a first process, a chemical oxide film ($SiO_2$) formed on the surface of a silicon substrate is etched off, which is followed by a process of forming a high-k gate insulating film mainly made of $HfO_2$ and having an effective oxide film thickness of 0.6 nm or less. However, even this method includes a process of drying the surface of the silicon substrate which is exposed after the silicon oxide film formed on the silicon substrate is etched off. Therefore, this method also suffers from a problem in that, similar to the case of the multi-oxide process, a watermark appears on the surface of the silicon substrate in the drying process, thus deteriorating the yield ratio.

Further, in the 30-nm generation and the following, especially from the 2X-nm generation (X is an arbitrary number, for example, 22), there has been a strong desire for suppressing the short-channel effects as compared to the previous generation. Accordingly, it is necessary to form an extremely thin gate insulating film having an effective oxide film thickness of 0.6 nm or less while suppressing the occurrence of watermarks which may be caused by the multi-oxide process.

In technological view of the above, the present invention has been developed, and it is an object of the present invention to provide a method for manufacturing, at a high yield ratio, MISFETs having an extremely thin high-k gate insulating film with an effective oxide film thickness of 0.6 nm or less, which is required in the further next generation. It is another object to provide a MISFET manufacturing method that well matches an actual LSI process including the multi-oxide process.

A description will be given of two embodiments according to the present invention with reference to the drawings. A first embodiment provides a method for manufacturing a planar complementary MISFET (CMISFET). A second embodiment provides a method for manufacturing a Fin-structured (double-gate) MISFET (hereinafter referred to as FinFET).

It is to be noted that identical reference numerals are given to similar components, and description on the similar components will not be repeated.

First Embodiment

A description will be given of a semiconductor device manufacturing method according to the first embodiment of the present invention with reference to FIGS. 1A to 1H.

(1) First, as can be seen from FIG. 1A, a trench is formed in a surface of a silicon substrate 1 by shallow trench isolation (STI) and an device isolation insulating film 2 is buried in the trench. The device isolation insulating film 2 is formed so that a region AR1 and a region AR2 in which elements are to be formed on the silicon substrate 1 may be electrically isolated from each other, for example, so that the regions AR1 and AR2 may each be enclosed. It is to be noted that the region AR1 is used to form n-type MISFET therein and the region AR2 is used to form p-type MISFET therein.

(2) Next, as shown in FIG. 1A, the silicon substrate 1 and the device isolation insulating film 2 are covered with a sacrificial film 5. The sacrificial film 5 is made of silicon oxide ($SiO_2$) and has a thickness of, for example, 8 nm.

(3) Next, as can be seen from FIG. 1A, the sacrificial film 5 in the region AR2 is covered with a photo resist (not shown), then p-type impurity ions are implanted to form a p-well 3 in the region AR1. Subsequently, the photo resist covering the sacrificial film 5 in the region AR2 is removed, to cover the sacrificial film 5 in the region AR1 with an another photo resist and then implant n-type impurity ions, thereby forming an n-well 4 in the region AR2. Then, the photo resist in the region AR1 is removed.

Figure 1B:
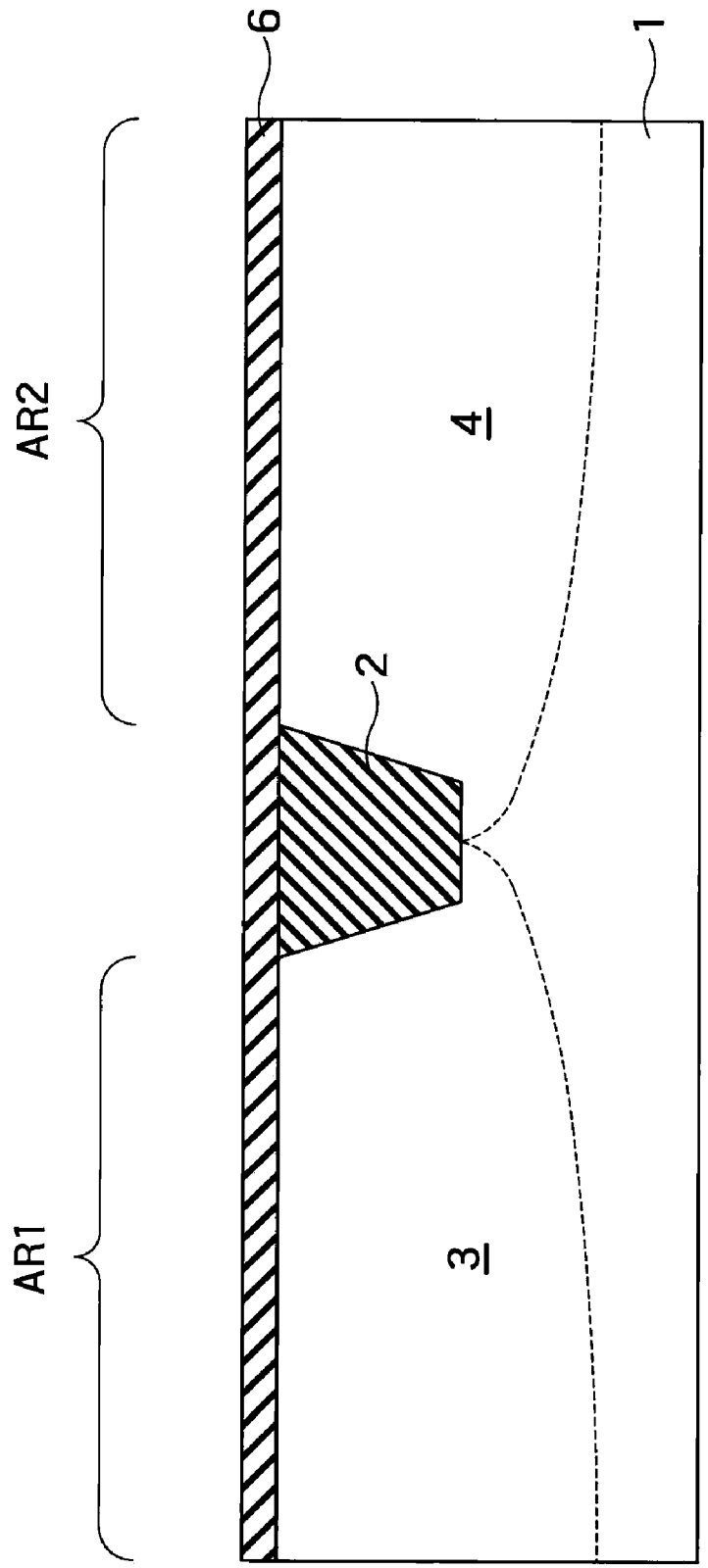
FIG. 1B is a cross-sectional view showing a process of manufacturing the semiconductor device according to the first embodiment following that of FIG. 1A.

(4) Next, as shown in FIG. 1B, the sacrificial film 5 on the silicon substrate 1 is removed by wet etching using a diluted hydrofluoric acid solution. In succession to it, the surface of the silicon substrate 1 is oxidized using ozone water, to form a silicon oxide film 6 ($SiO_2$). The silicon oxide film 6 has a thickness of, for example, 1.0 nm. It is to be noted that as the liquid oxidation agent, ozone water may be replaced with, for example, a hydrogen peroxide solution or aqueous solution $HCl/H_2O_2$ may be used.

By thus chemically oxidizing the surface of the silicon substrate 1 in succession to the removal of the sacrificial film 5, the silicon oxide film 6 can be formed without exposing the hydrophobic silicon surface of the silicon substrate 1 to an atmosphere. In such a manner, a watermark can be prevented from occurring.

Figure 1C:
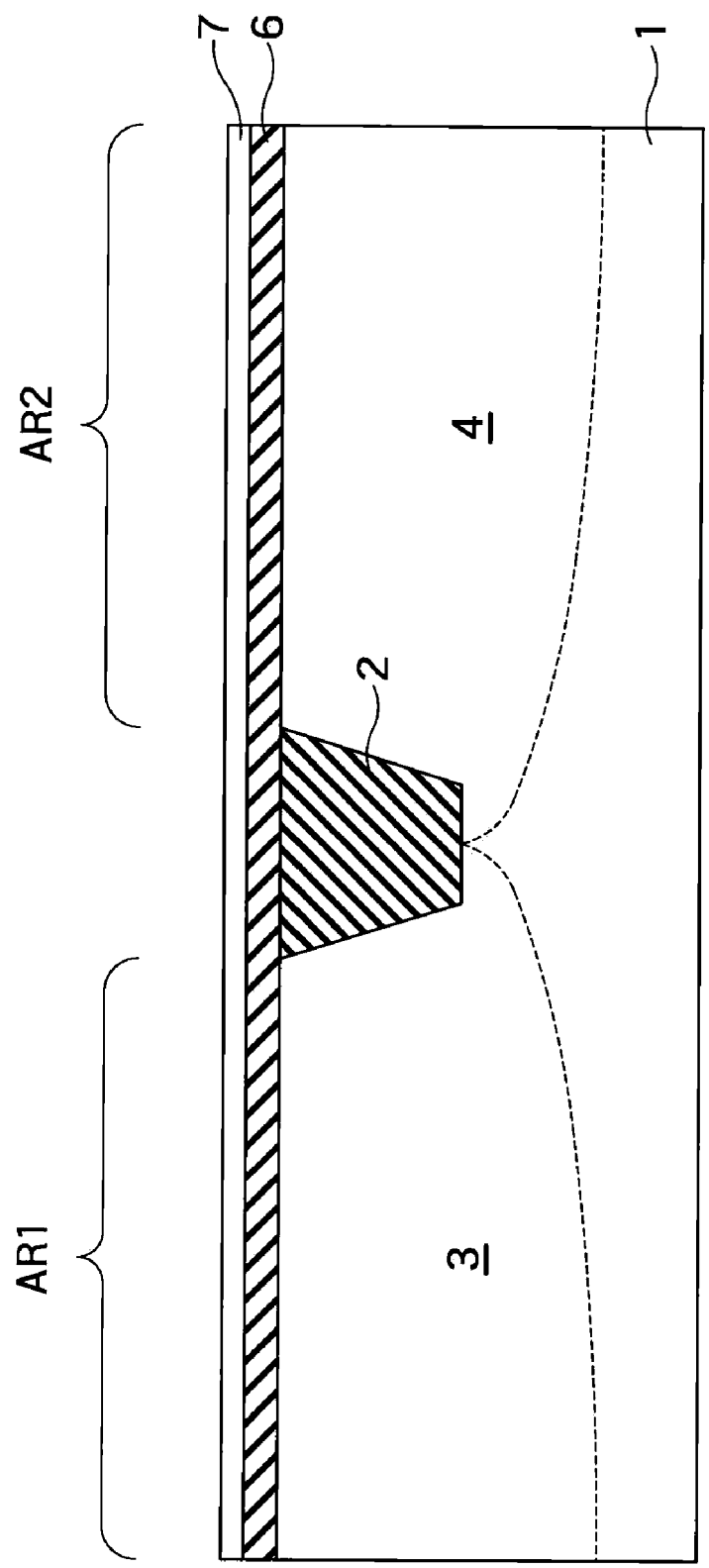
FIG. 1C is a cross-sectional view showing a process of manufacturing the semiconductor device according to the first embodiment following that of FIG. 1B.

(5) Next, as shown in FIG. 1C, by using atomic layer deposition (ALD), an aluminum oxide film 7 ($Al_2O_3$) is deposited on the silicon oxide film 6. The aluminum oxide film 7 has a thickness of, for example, 0.5 nm.

Preferably, the aluminum oxide film 7 is formed by ALD by use of tri-methyl aluminum (($CH_3)_3Al$):TMA) and water vapor ($H_2O$). By using ALD, it is possible to form the aluminum oxide film 7 that has a high uniformity of film thickness on the surface of a wafer, thereby improving the yield ratio.

It is to be noted that the aluminum oxide film 7 may be formed using chemical vapor deposition (CVD) or physical vapor deposition (PVD).

Figure 1D:
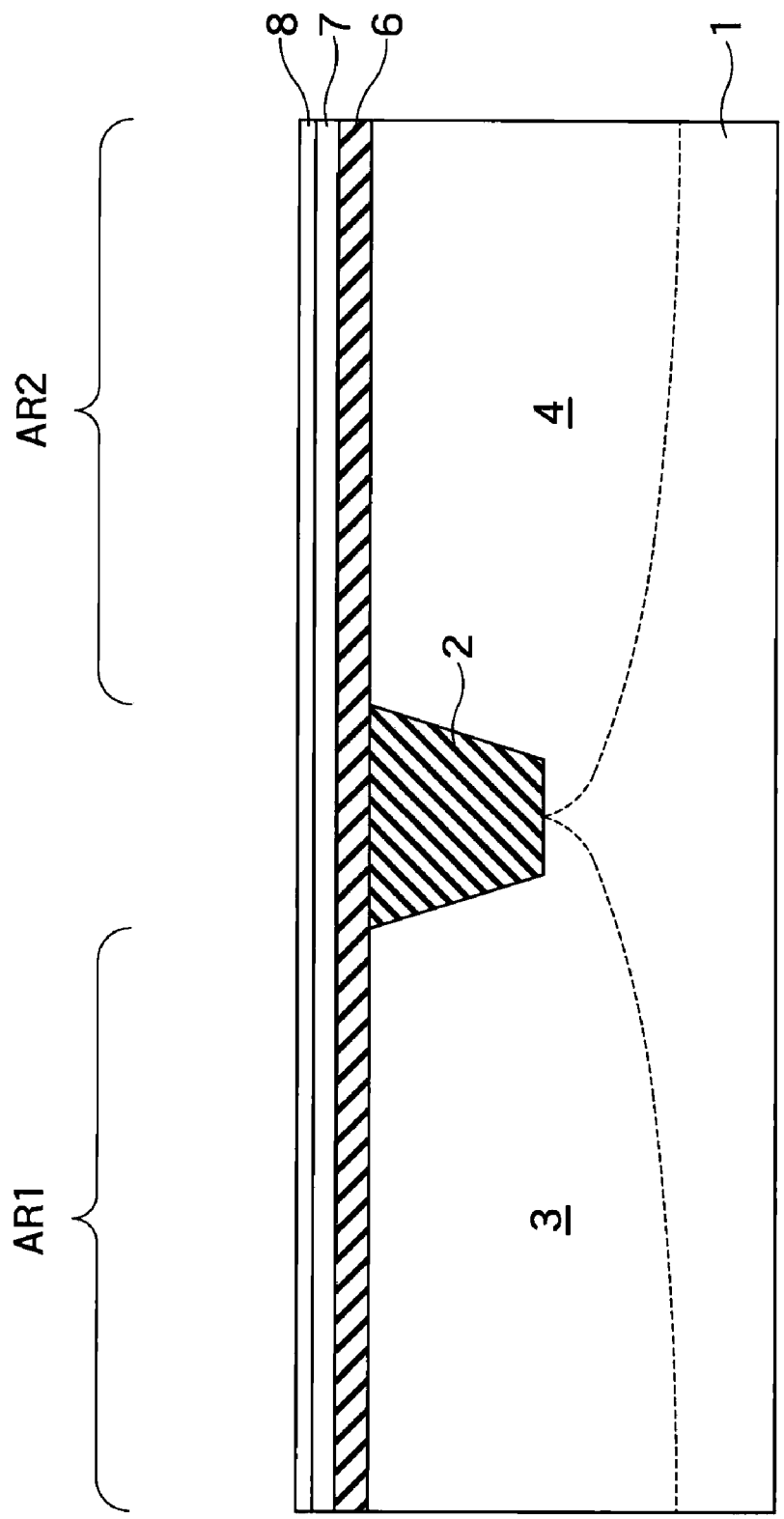
FIG. 1D is a cross-sectional view showing a process of manufacturing the semiconductor device according to the first embodiment following that of FIG. 1C.

(6) Next, as shown in FIG. 1D, by using PVD or ALD, a lanthanum oxide film 8 ($La_2O_3$) is deposited on the aluminum oxide film 7. The lanthanum oxide film 8 has a thickness of, for example, 0.3 nm.

Preferably, the lanthanum oxide film 8 is formed by PVD from the viewpoints of film quality, easiness to deposit, etc.

It is to be noted that preferably, the lanthanum oxide film 8 is formed by forming a lanthanum film and oxidizing it by exposing it to the air. That is, preferably the lanthanum oxide film 8 is formed by naturally oxidizing a lanthanum film. In this case, it need not be heated, so that the other portions such as the silicon substrate can be avoided from being oxidized, thereby suppressing an increase in effective oxide film thickness.

Further, the lanthanum oxide film can be replaced with any other rare earth oxide. Although preferably the lanthanum oxide film is formed because it has a relatively high dielectric constant, the lanthanum oxide film 8 may be replaced with a rare earth oxide film containing a rare earth element other than lanthanum or a magnesium oxide film. The rare earth oxide film that can be used may be a Scandium oxide film (Sc oxide film), Yttrium oxide film (Y oxide film), Cerium oxide film (Ce oxide film), Praseodymium oxide film (Pr oxide film), Neodymium oxide film (Nd oxide film), Promethium oxide film (Pm oxide film), Samarium oxide film (Sm oxide film), Europium oxide film (Eu oxide film), Gadolinium oxide film (Gd oxide film), Terbium oxide film (Tb oxide film), Dysprosium oxide film (Dy oxide film), Holmium oxide film (Ho oxide film), Erbium oxide film (Er oxide film), Thulium oxide film (Tm oxide film), Ytterbium oxide film (Yb oxide film), or Lutetium oxide film (Lu oxide film).

(7) Next, a hafnium silicate film (not shown) made of hafnium silicate (HfSiO), which is a high-k material, is deposited on the lanthanum oxide film 8. The hafnium silicate film has a thickness of, for example, 1.5 nm.

It is to be noted that the hafnium silicate film may be replaced with a deposited insulating thin film containing at least one of hafnium and zirconium. For example, this thin film that can be used may be a zirconium silicate film (ZrSiO), a hafnium zirconium oxide film (HfZrO), a hafnium zirconium silicate film (HfZrSiO), a hafnium oxide film ($HfO_2$), or a zirconium oxide film ($ZrO_2$).

Figure 1E:
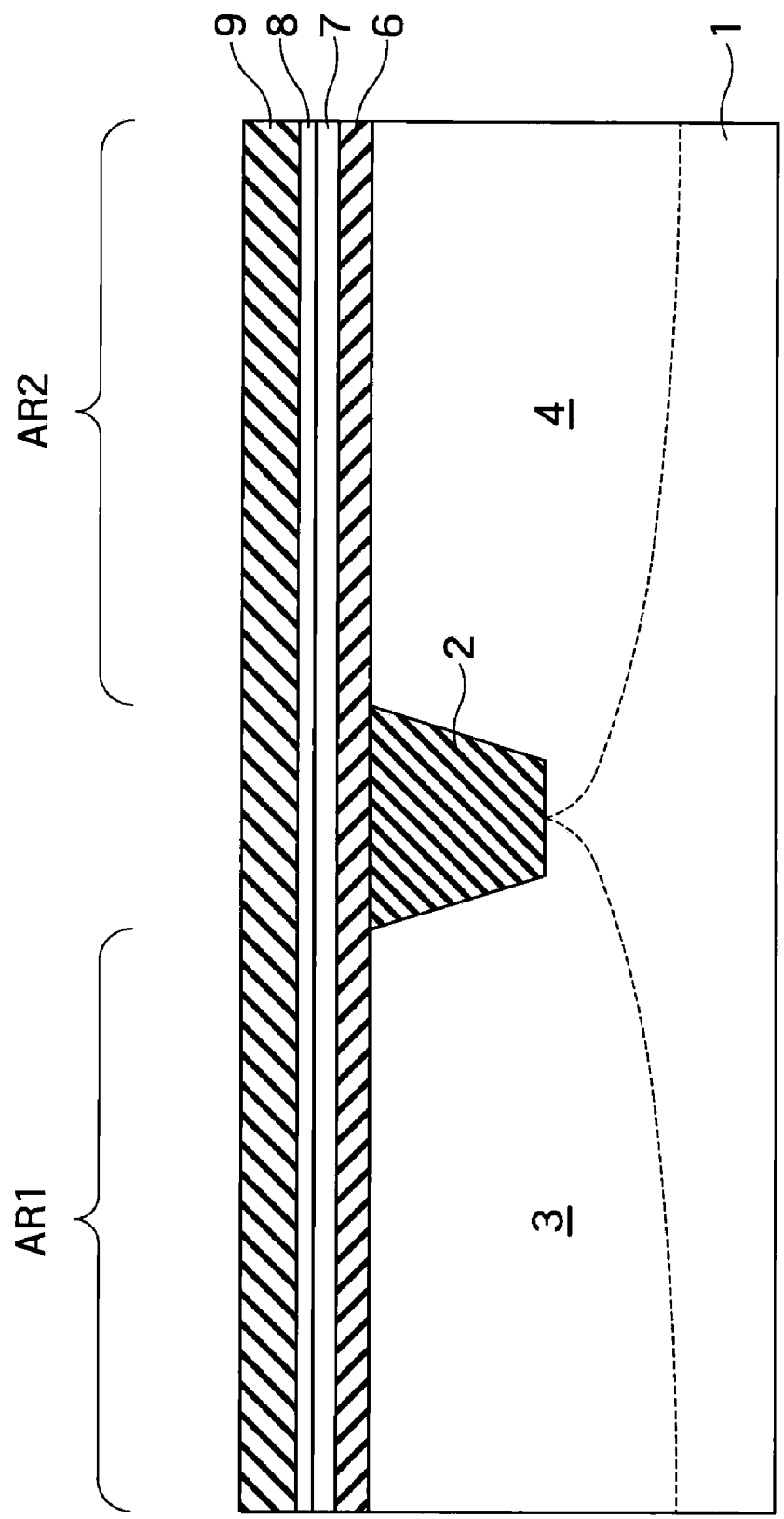
FIG. 1E is a cross-sectional view showing a process of manufacturing the semiconductor device according to the first embodiment following that of FIG. 1D.

(8) Next, by using plasma nitriding, nitrogen is introduced into the hafnium silicate film. The hafnium silicate film is thus changed into a nitrided hafnium silicate film 9 (HfSiON), as shown in FIG. 1E. Then, by conducting heat treatment, the introduced nitrogen is stabilized. In this case, heat treatment is carried out at 1000° C. and 5 Torr for 10 seconds. It is to be noted although described in detail later, by this heat treatment, the silicon oxide film 6, the aluminum oxide film 7, and the lanthanum oxide film 8 react with each other to provide an insulating film made of a mixture referred to as lanthanum aluminum silicate (LaAlSiO).

By nitriding the hafnium silicate film so as to provide the nitrided hafnium silicate film, thermal stability is improved. This holds true also with any other materials. For example, by nitriding the zirconium silicate film so as to provide nitrided zirconium silicate film, thermal stability is improved.

If thermal stability is improved in such a manner, the diffused layer formation technology including an activation annealing process similar to the conventional one can be applied to a subsequent-stage process of forming a source/drain diffused layer. Conversely, if such nitriding processing will not be performed, for example, in the case of a hafnium silicate film, it will be separated to $HfO_2$ and $SiO_2$, so that activation annealing cannot be performed.

Figure 1F:
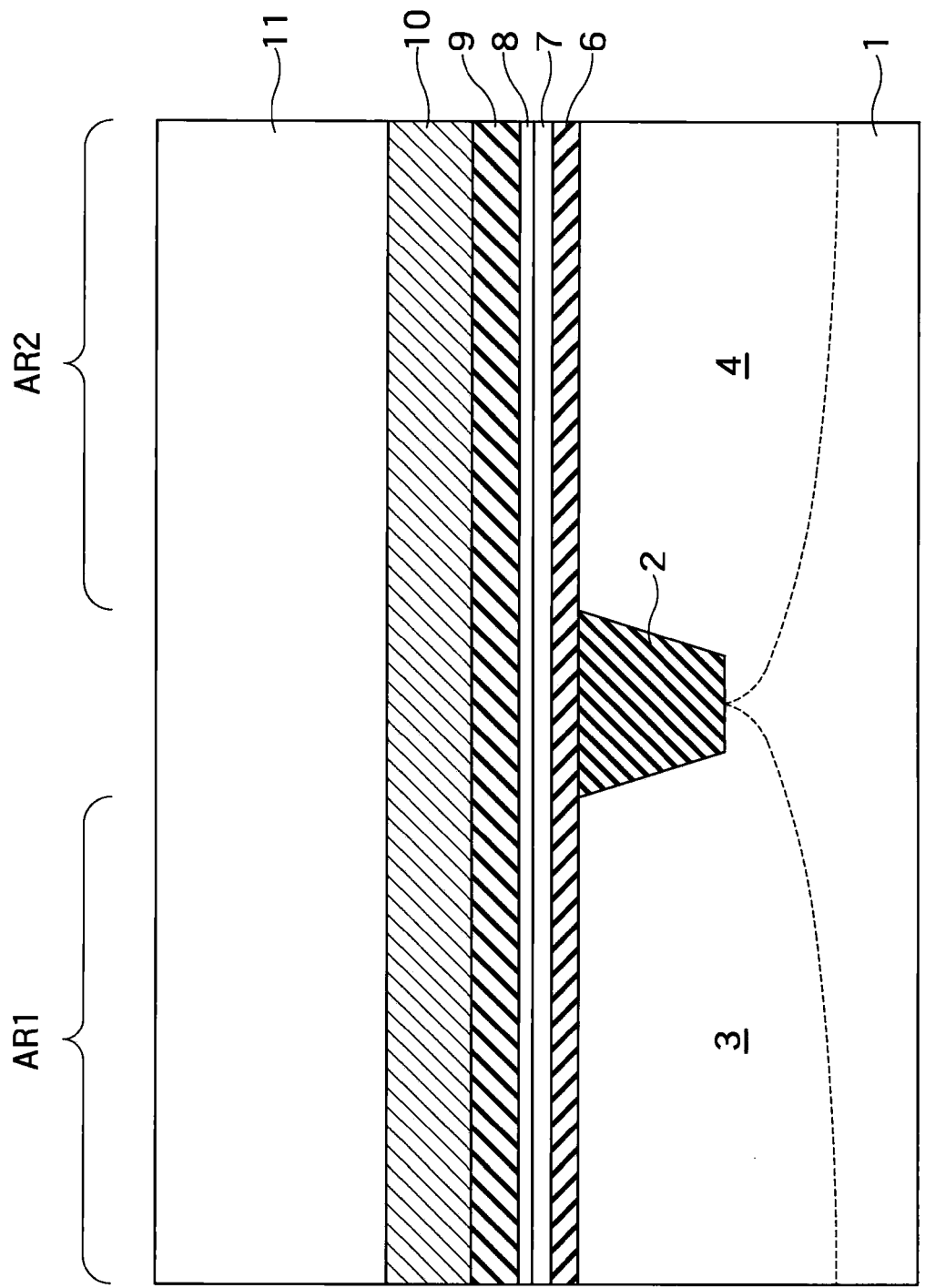
FIG. 1F is a cross-sectional view showing a process of manufacturing the semiconductor device according to the first embodiment following that of FIG. 1E.

(9) Next, as shown in FIG. 1F, a metal film 10 made of titanium nitride (TiN) and a polysilicon film 11 are sequentially deposited on the nitrided hafnium silicate film 9. Later, the metal film 10 and the polysilicon film 11 will make up gate electrodes of the MISFET. The metal film 10 has a thickness of, for example, 5 nm and the polysilicon film 11 has a thickness of for example 70 nm.

It is to be noted that although the process of forming the polysilicon film 11 can be omitted, the formation of the polysilicon film 11 has an advantage in that reactive ion etching (RIE) can be carried out easily to form a gate stack in the subsequent stage.

Further, as the material of the metal film 10, titanium nitride may be replaced with tantalum nitride (TaN) or tantalum carbide (TaC). In contrast to silicon having a midgap of about 4.6 eV, these materials (TiN, TaN, and TaC) have an effective work function in the range of 4.6±0.2 eV. It is thus possible to well match n-type MISFETs having a low threshold voltage and p-type MISFETs having a low threshold voltage on one device, thus giving high-performance CMISFETs. Moreover, it is unnecessary to form different metal films in the regions AR1 and AR2, thus giving an advantage of decreases in number of the processes and costs.

Figure 1G:
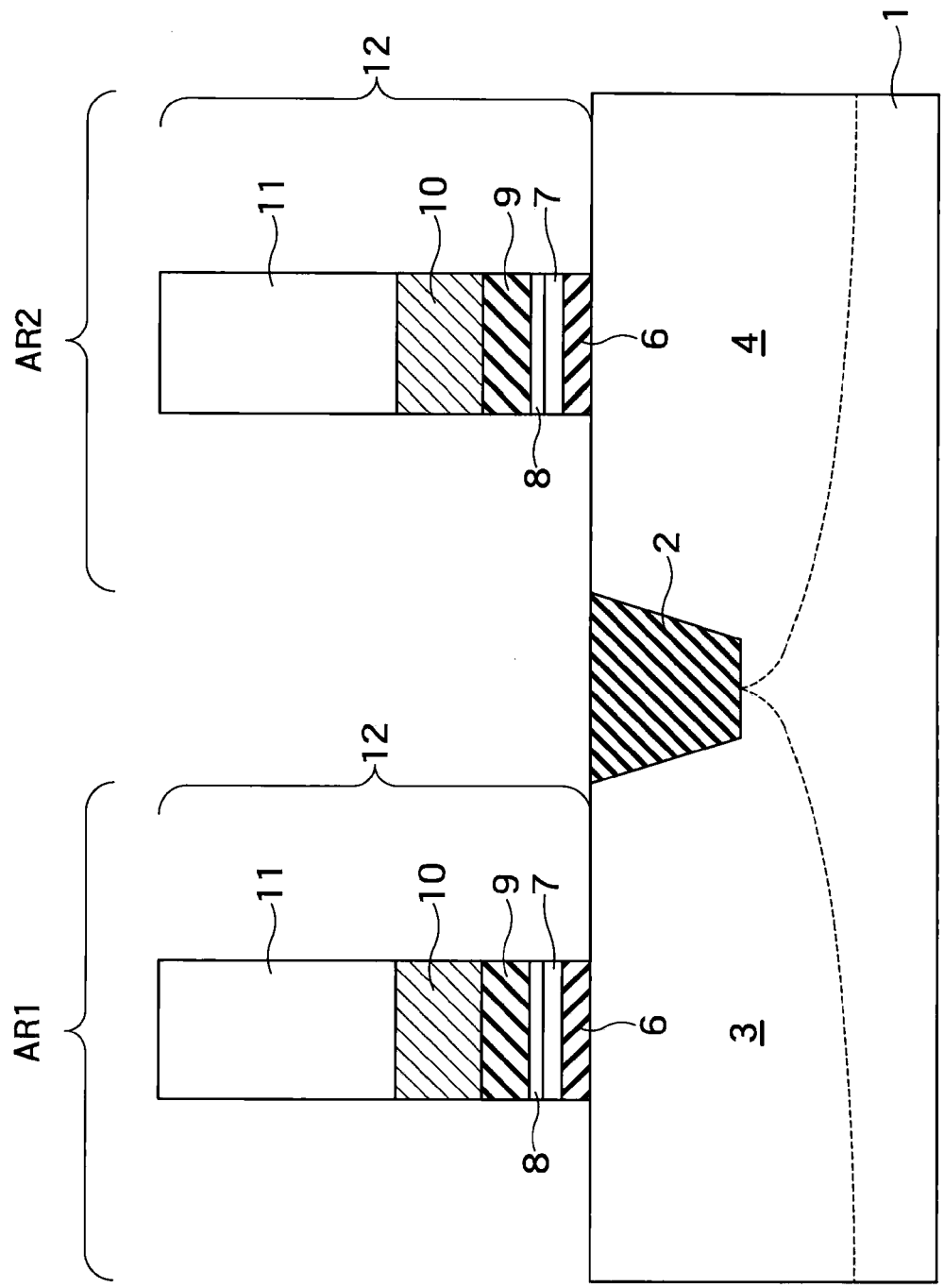
FIG. 1G is a cross-sectional view showing a process of manufacturing the semiconductor device according to the first embodiment following that of FIG. 1F.

(10) Next, as shown in FIG. 1G, a layer stack made of the silicon oxide film 6 through the polysilicon film 11 is etched using RIE, to form a gate stack 12.

Figure 1H:
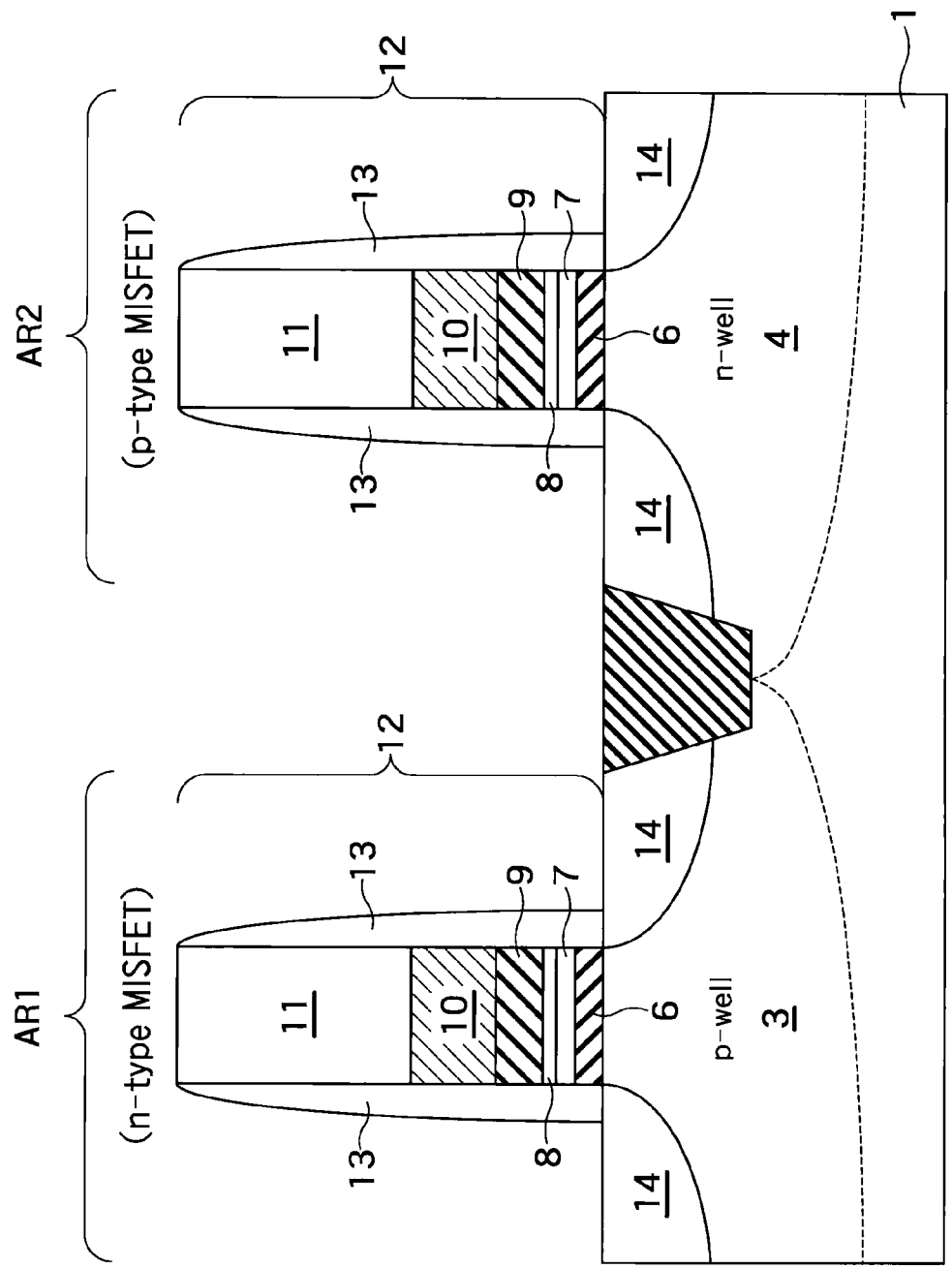
FIG. 1H is a cross-sectional view showing a process of manufacturing the semiconductor device according to the first embodiment following that of FIG. 1G.

(11) Next, as shown in FIG. 1H, a sidewall insulating film 13 is formed using an ordinary process technology, which is followed by the ion implantation and activation annealing processes, thus forming a source/drain diffused layer 14.

It is to be noted that a shallow diffused layer (not shown) referred to as an extension layer may be formed in the silicon substrate 1 below the sidewall diffused layer 13, thus providing a so-called lightly doped drain (LDD) structure.

By performing these processes, as shown in FIG. 1H, the n-type MISFET and the p-type MISFET are formed in the regions AR1 and AR2 respectively.

Although the subsequent processes are not shown, actually, a publicly-known FET manufacturing technology is used to form a silicide film on the polysilicon film 11 and the source/drain diffused layer 14. Then, an inter-layer insulating film is formed in such a manner as to cover the MISFETs and has a contact plug formed in the inter-layer insulating film. The contact plug electrically connects the silicide films of the MISFETs and interconnection patterns formed on the inter-layer insulating film to each other. Thus, a semiconductor device having planar CMISFETs is completed.

Next, a description will be given of reasons why a gate insulating film having an extremely small effective oxide film thickness can be obtained by these processes.

As described above, the process of forming MISFETs according to the present embodiment has two heat processes, that is, the heat process performed to stabilize nitrogen introduced into the hafnium silicate film and that performed to form the source/drain diffused layer 14. In the heat processes, the silicon oxide film 6, the aluminum oxide film 7, and the lanthanum oxide film 8 react with each other to provide an insulating film made of the mixture referred to as lanthanum aluminum silicate (LaAlSiO). This lanthanum aluminum silicate film is insulating and has a higher dielectric constant than the silicon oxide. The lanthanum aluminum silicate mixture has a film thickness of about 1 nm. In the heat processes, lanthanum (La) in the lanthanum oxide film 8 is partially diffused into the nitrided hafnium silicate film 9, to change at least part of the nitrided hafnium silicate film 9 into nitrided hafnium lanthanum silicate (HfLaSiON). The nitrided hafnium lanthanum silicate has a higher dielectric constant than nitrided hafnium silicate.

The silicon oxide film 6, the aluminum oxide film 7, the lanthanum oxide film 8, and the nitrided hafnium silicate film 9 are heat-treated in such a manner as to generate a new mixture, thereby giving a gate insulating film having a higher dielectric constant. The gate insulating film formed by the method according to the present embodiment has about five times the dielectric constant of the silicon oxide film. The physical film thickness (sum of the film thickness of the lanthanum aluminum silicate film and that of the nitrided hafnium silicate film) is about 2.5 nm, so that the gate insulating film has an effective oxide film thickness (EOT) of about 0.5 nm (=2.5 nm/5). Accordingly, in the present embodiment, it is possible to form a gate insulating film having an effective oxide film thickness of 0.6 nm or less.

Moreover, in the present embodiment, the gate insulating film has a relatively large physical film thickness (about 2 to 2.5 nm), so that it is possible to suppress a leakage current to a sufficiently low level. It will be described with reference to FIG. 2.

Figure 2:
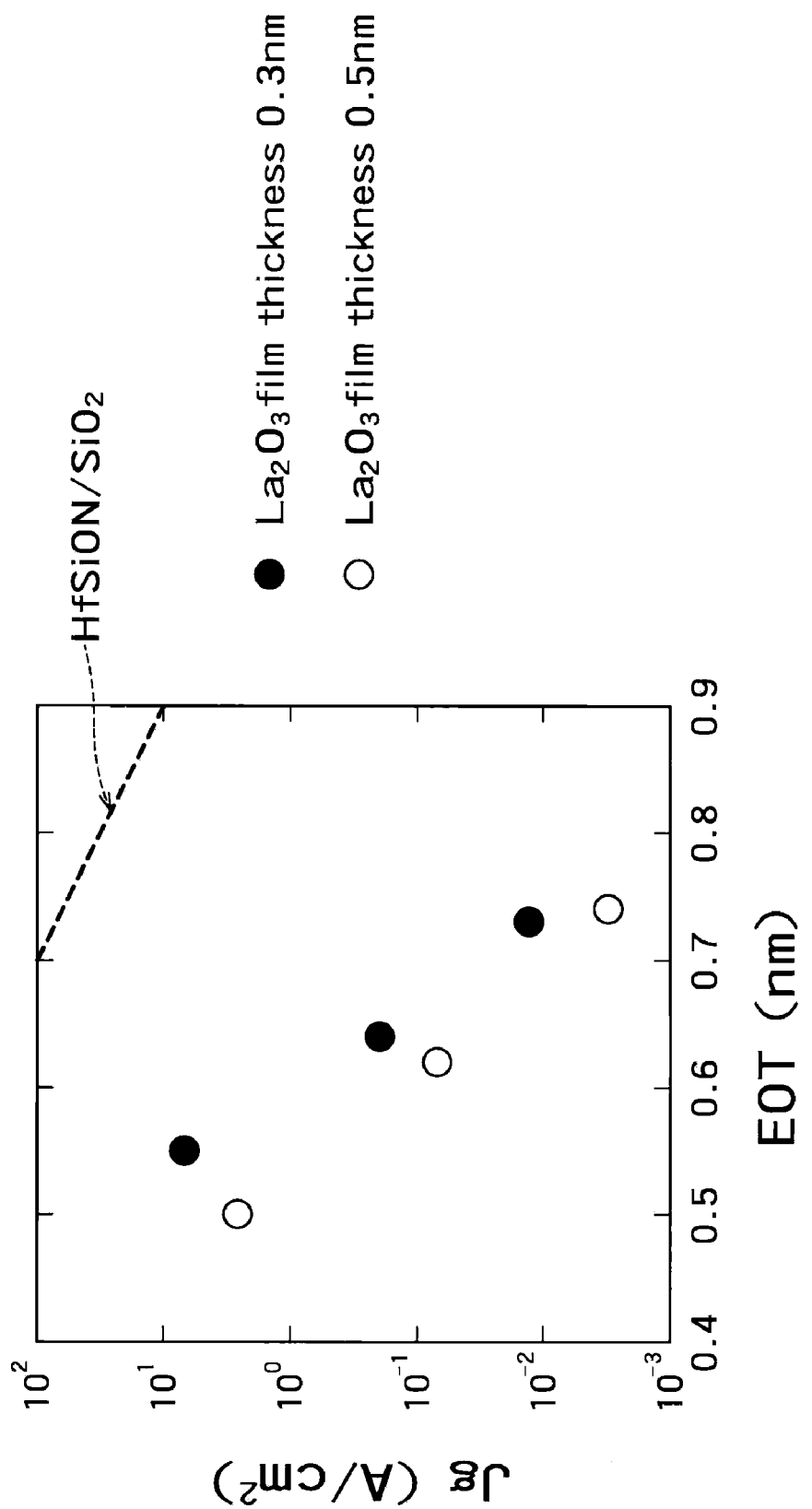
FIG. 2 is a graph showing a relationship between a leakage current and an effective oxide film thickness.

FIG. 2 is a graph in which a leakage current (Jg) at the time when an electric field (4.5 MV/cm) is applied to a insulator (gate insulating film) is plotted for each of six MISFET samples manufactured by the method according to the present embodiment and having different effective oxide film thicknesses (EOT). The film thicknesses at the time of formation are 1.0 nm and 0.5 nm of the silicon oxide film 6 and the aluminum oxide film 7 respectively. The lanthanum oxide film 8 has two film thicknesses: one is 0.3 nm (indicated by ●) and the other is 0.5 nm (indicated by ○).

A broken line in FIG. 2 indicates the leakage current of such MISFETs that the process of forming the aluminum oxide film 7 and the lanthanum oxide film 8 is omitted. That is, in formation of the MISFETs, the silicon oxide film 6 is formed, then, the hafnium silicate film is deposited on this silicon oxide film 6, and then nitrogen is introduced into this hafnium silicate film to form the nitrided hafnium silicate film 9 by plasma nitriding.

As can be seen from FIG. 2, the leakage current of such MISFETs manufactured by the method according to the present embodiment is dramatically smaller than that of the MISFETs that the process of forming the aluminum oxide film 7 and the lanthanum oxide film 8 is omitted. Therefore, by the present embodiment, it is possible to manufacture semiconductor devices having a small leakage, current, that is, small dissipation power.

Furthermore, as described above, the present embodiment permits no watermarks to appear and, therefore, can improve the yield ratio and be applied to the actual LSI process including the multi-oxide process.

As described above, in the present embodiment, it is possible to manufacture, at a high yield ratio, MISFETs that have a gate insulating film with an extremely small effective oxide film thickness and small dissipation power.

It is to be noted that although in the above description, a silicon substrate has been used as the semiconductor substrate, the present invention is not limited to it; for example, such a substrate may be employed as a silicon on insulator (SOI) substrate or a silicon substrate or SOI substrate on which a silicon germanium (SiGe) layer is epitaxially grown.

Further, although the above description has given the method for manufacturing complementary MISFETs having a twin-well structure, the present invention is not limited to it; the MISFETs having a single-well or triple-well structure may be manufactured.

Further, in place of the silicon oxide film 6, a silicon oxynitride film (SiON) may be formed. More generally, in place of the silicon oxide film 6, a thin film may be formed which is made of the oxide of an element that composes the semiconductor substrate. A method for forming SiON will be described in detail as follows. A chemical oxide film is formed on the surface of the silicon substrate 1 and then oxidized at a temperature of about 700° C. Subsequently, nitrogen is introduced into the chemical oxide film by plasma nitriding and then is caused to undergo nitrogen annealing at 1000° C. for 30 seconds and reduced-pressure oxidation at 900° C. for 10 seconds.

Further, instead of forming two layers of the aluminum oxide film 7 and the lanthanum oxide film 8, a lanthanum aluminate ($LaAlO_3$) film may be formed.

Second Embodiment

Next, a description will be given of a semiconductor device manufacturing method according to the second embodiment of the present invention. The present embodiment relates to a method for manufacturing an FinFET having a gate insulating film which is obtained by performing a heat process on a multi-layer insulating film similar to that in the first embodiment and formed on at least side surfaces of a fin.

A description will be given below of the present embodiment with reference to FIGS. 3A to 3F. FIGS. 3A to 3E show cross-sectional views of a channel portion of the FinFET and FIG. 3F, a perspective view of the FinFET.

Figure 3A:
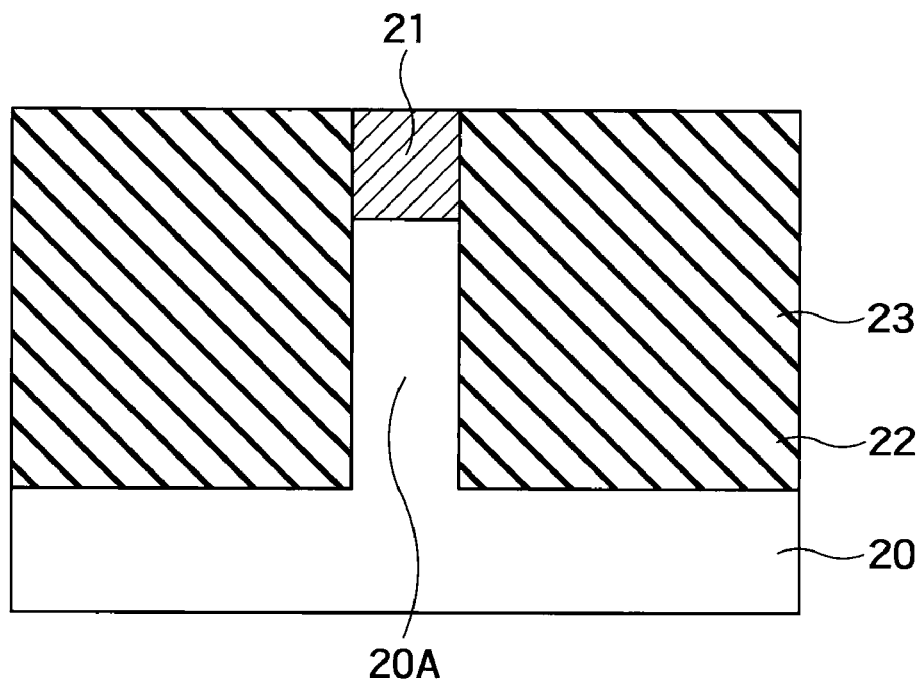
FIG. 3A is a cross-sectional view showing a process of manufacturing a semiconductor device according to a second embodiment.

(1) First, as can be seen from FIG. 3A, a mask material 21 is deposited on a silicon substrate 20. The mask material 21 is made of, for example, a silicon nitride film (SiN) and has a thickness of about 100 nm. It is to be noted that the mask material 21 is not limited to a silicon nitride film but may be of any other insulating film such as a silicon oxide film ($SiO_2$).

(2) Next, as can be seen from FIG. 3A, the mask material 21 is patterned using lithography and RIE. Further, by using the patterned mask material 21, the silicon substrate 20 is etched. Thus, an element separation trench 22 having a depth of about 200 nm from a surface of the silicon substrate 20 is formed, together with a fin 20A as well.

(3) Next, as can be seen from FIG. 3A, by using high density plasma (HDP) CVD, an device isolation insulating film 23 made of, for example, a silicon oxide film is deposited everywhere on the surfaces of the semiconductor substrate 20 and the mask material 21 in such a manner as to fill the element separation trench 22. Subsequently, by using the mask material 21 as a stopper, the device isolation insulating film 23 is flattened utilizing chemical mechanical polishing (CMP). Thus, as shown in FIG. 3A, a top surface of the mask material 21 is exposed.

Figure 3B:
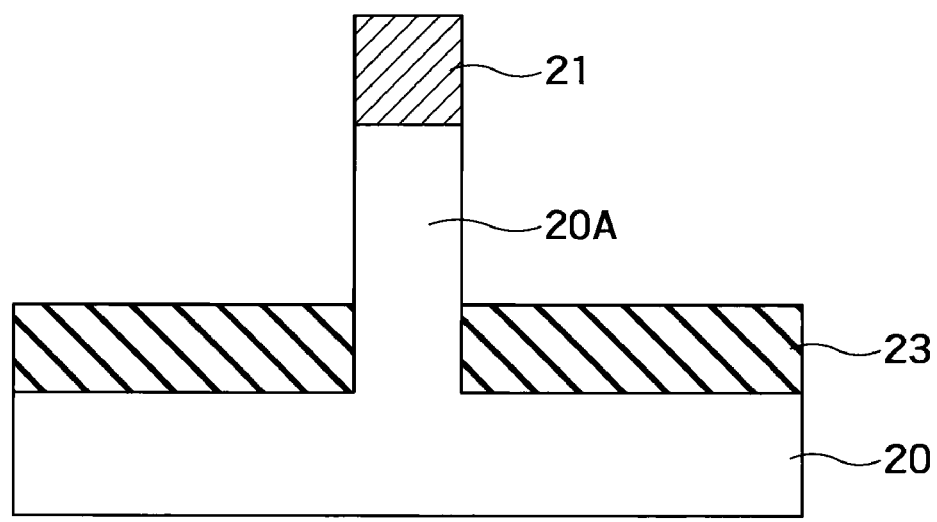
FIG. 3B is a cross-sectional view showing a process of manufacturing the semiconductor device according to the second embodiment following that of FIG. 3A.

(4) Next, as shown in FIG. 3B, wet etching by use of a hydrofluoric acid solution is performed using the mask material 21 as a mask. The device isolation insulating film 23 is etched off until it has a reduced film thickness of about 100 nm.

It is to be noted that the device isolation insulating film 23 may be etched off by RIE rather than wet etching. In this case, after etch-off, the FET is rinsed with a diluted hydrofluoric acid solution (DHF), to remove residues.

Figure 3C:
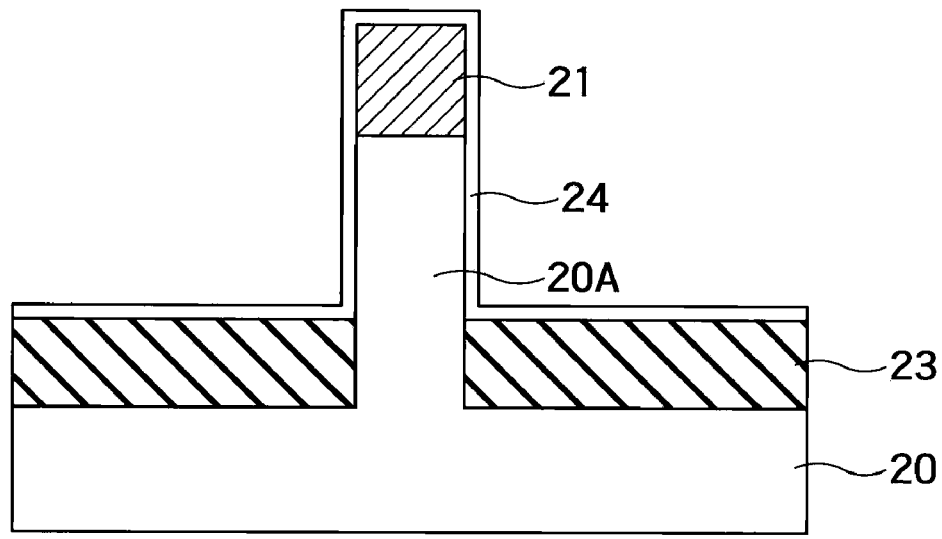
FIG. 3C is a cross-sectional view showing a process of manufacturing the semiconductor device according to the second embodiment following that of FIG. 3B.

(5) Next, as shown in FIG. 3C, on a side surface of the fin 20A, a gate insulating film 24 is formed which is given by a multi-layer film described with the first embodiment. That is, the gate insulating film 24 is a multi-layer insulating film made up of the silicon oxide film 6, the aluminum oxide film 7, the lanthanum oxide film 8, and the nitrided hafnium silicate film 9. It is to be noted that, as can be seen from FIG. 3C, the gate insulating film 24 is formed also on the side surface and the top surface of the mask material 21 and over the device isolation insulating film 23 as well.

Below, a description will be given in detail of the method for forming the gate insulating film 24.

(5-1) In succession to etch-off of the device isolation insulating film 23, the side surface of the fin 20A is oxidized without being exposed to an atmosphere by using ozone water, a hydrogen peroxide solution, or an aqueous solution HCl/$H_2O_2$, thereby forming a silicon oxide film 6 on the side surface of the fin 20A. The silicon oxide film 6 has a thickness of, for example, 1.0 nm. It is to be noted that if the device isolation isolating film 23 is etched off by RIE, the silicon oxide film 6 is formed in succession to rinse by use of a diluted hydrofluoric acid solution (without exposing the side surface of the fin 20A to the atmosphere).

(5-2) Next, an aluminum oxide film 7 is deposited on the silicon oxide film 6 by using ALD. The aluminum oxide film 7 has a thickness of, for example, 0.5 nm.

(5-3) Next, a lanthanum oxide film 8 is deposited on the aluminum oxide film 7 by using ALD. The lanthanum oxide film 8 has a thickness of, for example, 0.3 nm.

(5-4) Next, a hafnium silicate film is deposited on the lanthanum oxide film 8 by using ALD. The hafnium silicate film has a thickness of, for example, 1.5 nm.

(5-5) Next, by using plasma nitriding, nitrogen is introduced into the hafnium silicate film. The hafnium silicate film is thus changed into a nitrided hafnium silicate film 9 (HfSiON). Then, by conducting heat treatment, the introduced nitrogen is stabilized. In this case, heat treatment is carried out at 1000° C. and 5 Torr for 10 seconds. By this heat treatment, a gate insulating film 24 is formed which includes the silicon oxide film 6, the aluminum oxide film 7, the lanthanum oxide film 8, and the nitrided hafnium silicate film 9.

It is to be noted that by depositing the aluminum oxide film 7, the lanthanum oxide film 8, and the hafnium silicate film 9A by using ALD, they can be formed uniformly on the side surface of the fin 20A.

Figure 3D:
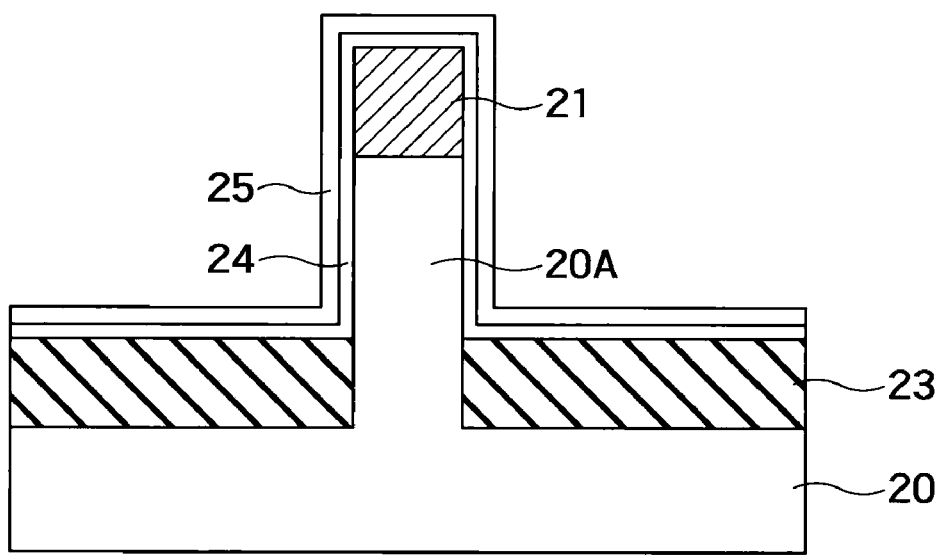
FIG. 3D is a cross-sectional view showing a process of manufacturing the semiconductor device according to the second embodiment following that of FIG. 3C.

(6) Next, as shown in FIG. 3D, a metal film 25 made of titanium nitride (TiN) is deposited on the gate insulating film 24 by using ALD. The metal film 25 has a thickness of, for example, 5 nm. It is to be noted that in place of titanium nitride, tantalum nitride (TaN) or tantalum carbide (TaC) may be used as the material of the metal film 25.

Figure 3E:
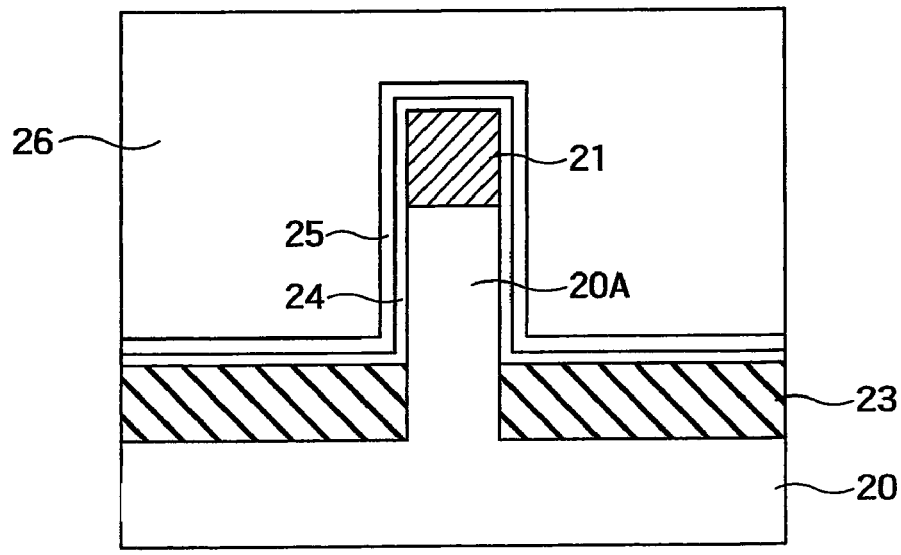
FIG. 3E is a cross-sectional view showing a process of manufacturing the semiconductor device according to the second embodiment following that of FIG. 3D.

(7) Next, as shown in FIG. 3E, a polysilicon film 26 is deposited by using CVD etc. The polysilicon film 26 has a thickness of, for example, 300 nm.

Figure 3F:
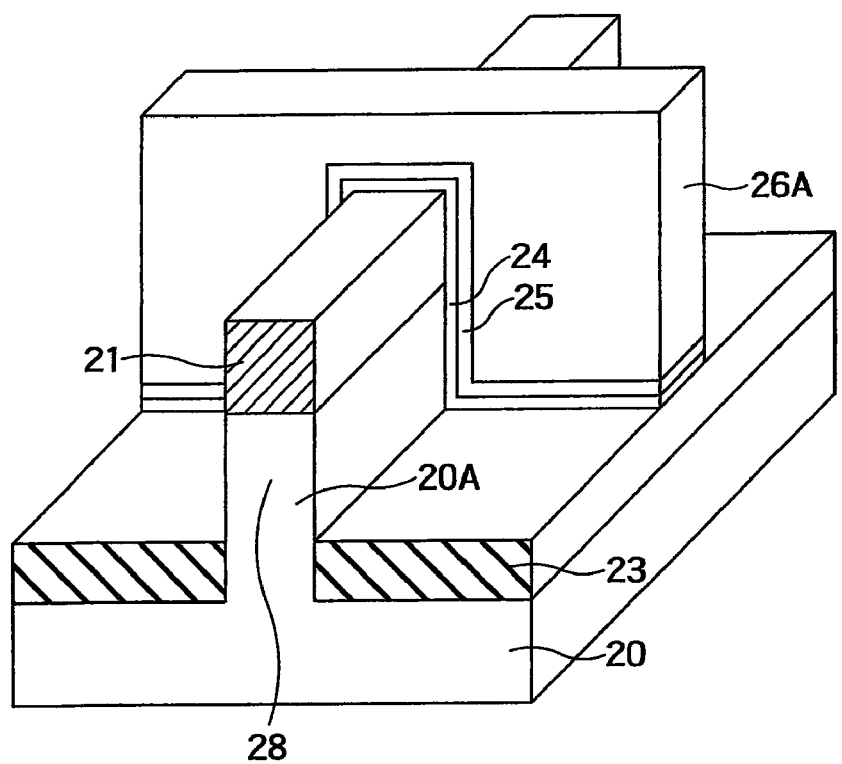
FIG. 3F is a perspective view of an FinFET manufactured by the method according to the second embodiment.

(8) Next, as can be seen from FIG. 3F, the polysilicon film 26 is patterned using lithography and RIE, to form a gate pattern 26A. Subsequently, as shown in FIG. 3F, portions of the gate insulating film 24 and the metal film 25 that are not covered by the gate pattern 26A are removed using a diluted hydrofluoric acid solution.

(9) Next, a sidewall insulating film (not shown) is formed on a side surface of the gate pattern 26A that meets the fin 20A.

(10) Subsequently, as shown in FIG. 3F, ions are implanted into the fin 20A by using oblique ion implantation or plasma doping. Thus, a source/drain region 28 is formed on portions of the fin 20A that are not covered by the gate pattern 26A. The source/drain region 28 is formed so as to embrace a channel region which is a portion of the fin 20A and enclosed by the gate pattern 26A.

Through these processes, such an FinFET as shown in FIG. 3F is formed.

Although the subsequent processes are not shown, actually, a silicide film is formed on the gate pattern 26A and the source/drain region 28. Then, an inter-layer insulating film is formed so as to cover the FinFET and has a contact plug formed in the inter-layer insulating film. The contact plug electrically connects the silicide films of the FinFETs and interconnection patterns formed on the inter-layer insulating film, to each other. Thus, a semiconductor device having the FinFETs is completed. The FinFET has the gate insulating film that has an extremely small effective oxide film thickness and a small leakage current. Further, after the device isolation insulating film 23 is etched off, a chemical oxide film is formed without exposing the side surface of the fin 20A to the atmosphere, so that a watermark is prevented from occurring. Therefore, the yield ratio can be improved.

It is to be noted that besides the aforesaid method, the following method can be used for forming the gate pattern 26A.

(1) After being deposited, the polysilicon film 26 is flattened by CMP by using the mask material 21 as a stopper.

(2) Subsequently, the polysilicon film 27 is deposited on the flattened polysilicon film 26 and the exposed mask material 21 by using CVD etc.

(3) Subsequently, the polysilicon films 26 and 27 are patterned using lithography and RIE, to form a gate pattern.

By using this method, it is possible to manufacture a semiconductor device in which planar MOSFETs and FinFETs are combined with each other by using simple processes and also form fine gate patterns, as described in detail in Japanese Patent Application Laid-Open No. 2006-339514.

Further, although in the description of the present embodiment, the mask material 21 has remained to the end, the present invention is not limited to it; instead, after the fin 20A is formed, the mask material 21 is removed to then form a gate insulating film not only on a couple of mutually opposite side surfaces of the fin 20A but also on a top surface of the fin 20A. Thus, a so-called tri-gate FET may be formed.

Next, a description will be given of a variant of the present embodiment. The variant uses a silicon on insulator (SOI) substrate as a semiconductor substrate. A method for manufacturing an FinFET in the case of using the SOI substrate will be described with reference to FIG. 4.

(1) An SOI substrate is prepared in which a silicon substrate 30, a BOX layer 31, and a silicon layer are stacked sequentially.

(2) On the silicon layer, a mask material 21 made of, for example, a silicon nitride film (SiN) is deposited.

(3) Next, the mask material 21 is patterned using lithography and RIE. Further, by using the mask material 21 as a mask, the silicon layer is etched off until the BOX layer 31 is exposed. Thus, a fin 32A is formed which is electrically insulated by the BOX layer 31. It is to be noted that this etch-off may be wet etching by use of, for example, a hydrofluoric acid solution or RIE. In the case of using RIE, after etching, the FET is rinsed with a diluted hydrofluoric acid solution (DHF), to remove residues. Further, the fin 32A has a height which is equal to the thickness of the silicon layer.

Figure 4:
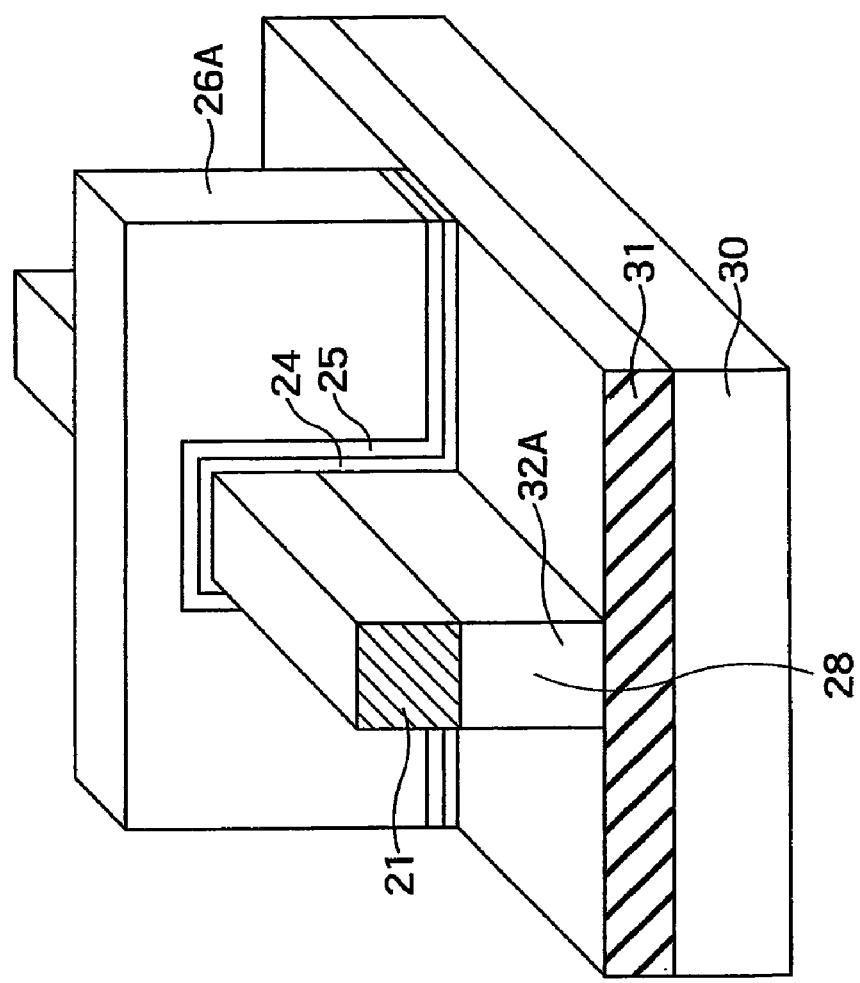
FIG. 4 is a perspective view of a variant of an FinFET manufactured by the method according to the second embodiment.

The subsequent processes following this gate insulation film formation process are the same as those in the aforesaid case of using the silicon substrate 1, and description on them will not be repeated. FIG. 4 shows a perspective view of an FinFET in the case of using an SOI substrate. As may be clear from the above-described manufacturing method, by using an SOI substrate, an advantage of simplified manufacturing processes can be obtained. Moreover, the fins 32A have small irregularities in height, so that characteristic fluctuations can be suppressed in performance of the FinFETs.

As described above, in the present embodiment, it is possible to manufacture, at a high yield ratio, FinFETs that have a gate insulating film with an extremely small effective oxide film thickness and small dissipation power.

Additional advantages and modifications will readily occur to those skilled in the art.

Therefore, the invention in its broader aspects is not limited to the specific details and representative embodiments shown and described herein.

Accordingly, various modifications may be made without departing from the spirit or scope of the general inventive concepts as defined by the appended claims and their equivalents.

What is claimed is:

1. A semiconductor device manufacturing method comprising:

removing an insulating film on a semiconductor substrate by using wet etching and subsequently oxidizing a surface of the semiconductor substrate by using a liquid oxidation agent without exposing this surface to an atmosphere, thereby forming a first insulating film containing an oxide of a constituent element of the semiconductor substrate on the surface of the semiconductor substrate;

forming a second insulating film containing an aluminum oxide on the first insulating film;

forming a third insulating film containing a rare earth oxide on the second insulating film;

forming a high-k insulating film containing at least one of hafnium and zirconium on the third insulating film;

introducing nitrogen into the high-k insulating film to thereby make the high-k insulating film a fourth insulating film; and subsequently conducting heat treatment to thereby change the first, second and third insulating films into an insulating film made of a mixture containing aluminum, a rare earth element, the constituent element of the semiconductor substrate, and oxygen.

2. The semiconductor device manufacturing method according to claim 1, wherein as the liquid oxidation agent, ozone water, a hydrogen peroxide solution, or aqueous solution $HCl/H_2O_2$ is used.

3. The semiconductor device manufacturing method according to claim 2, wherein an aluminum oxide film is formed as the second insulating film, a lanthanum oxide film is formed as the third insulating film, and lanthanum aluminum silicate is formed as the mixture by the heat treatment.

4. The semiconductor device manufacturing method according to claim 3, wherein the lanthanum oxide film is formed by depositing a lanthanum film on the aluminum oxide film and oxidizing the lanthanum film in the air.

5. The semiconductor device manufacturing method according to claim 2, wherein a metal film whose effective work function is in the range of 4.6±0.2 eV is formed on the fourth insulating film.

6. The semiconductor device manufacturing method according to claim 5, wherein as the metal film, a titanium nitride film, a tantalum nitride film, or a tantalum carbide film is used.

7. The semiconductor device manufacturing method according to claim 5, wherein a polysilicon film is formed on the metal film.

8. The semiconductor device manufacturing method according to claim 1, wherein
a hafnium silicate film is formed as the high-k insulating film, and
nitrogen is introduced into the hafnium silicate film to thereby change the hafnium silicate film into a nitrided hafnium silicate film as the fourth insulating film.

9. The semiconductor device manufacturing method according to claim 1, wherein
a zirconium silicate film is formed as the high-k insulating film, and
nitrogen is introduced into the zirconium silicate film to thereby change the zirconium silicate film into a nitrided zirconium silicate film as the fourth insulating film.

10. A method for manufacturing semiconductor devices having a complementary MISFET combining an n-type MISFET and a p-type MISFET, the method comprising:
forming on a semiconductor substrate a device isolation insulating film that electrically isolates a first region on the semiconductor substrate in which the n-type MISFET is to be formed and a second region on the semiconductor substrate in which the p-type MISFET is to be formed;
covering the semiconductor substrate with a sacrificial film;
covering the sacrificial film in the second region with a first photo resist and then implanting p-type impurity ions into the sacrificial film to thereby form a p-well in the first region;
covering the sacrificial film in the first region with a second photo resist and then implanting n-type impurity ions into the sacrificial film to thereby form an n-well in the second region;
removing the sacrificial film on the semiconductor substrate by using wet etching and subsequently oxidizing a surface of the semiconductor substrate by using a liquid oxidation agent without exposing this surface to an atmosphere, thereby forming a first insulating film containing an oxide of a constituent element of the semiconductor substrate on the surface of the semiconductor substrate in the first and second regions;
forming a second insulating film containing an aluminum oxide on the first insulating film;
forming a third insulating film containing a rare earth oxide on the second insulating film;
forming a high-k insulating film containing at least one of hafnium and zirconium on the third insulating film;
introducing nitrogen into the high-k insulating film to thereby make the high-k insulating film a fourth insulating film; and
subsequently conducting heat treatment to thereby stabilize the nitrogen in the fourth insulating film and also change the first, second and third insulating films into an insulating film made of a mixture containing aluminum, a rare earth element, the constituent element of the semiconductor substrate, and oxygen.

11. The semiconductor device manufacturing method according to claim 10, wherein
as the semiconductor substrate, a silicon substrate is used,
as the liquid oxidation agent, ozone water, a hydrogen peroxide solution, or aqueous solution $HCl/H_2O_2$ is used, and
as the first insulating film, a silicon oxide film is formed.

12. The semiconductor device manufacturing method according to claim 11, wherein
an aluminum oxide film is formed as the second insulating film,
a lanthanum oxide film is formed as the third insulating film, and
lanthanum aluminum silicate is formed as the mixture by the heat treatment.

13. The semiconductor device manufacturing method according to claim 12, wherein the lanthanum oxide film is formed by depositing a lanthanum film on the aluminum oxide film and oxidizing the lanthanum film in the air.

14. The semiconductor device manufacturing method according to claim 11, wherein a metal film whose effective work function is in the range of 4.6±0.2 eV is formed on the fourth insulating film.

15. The semiconductor device manufacturing method according to claim 14, wherein as the metal film, a titanium nitride film, a tantalum nitride film, or a tantalum carbide film is used.

16. The semiconductor device manufacturing method according to claim 14, wherein a polysilicon film is formed on the metal film.

17. The semiconductor device manufacturing method according to claim 10, wherein
a hafnium silicate film is formed as the high-k insulating film, and
nitrogen is introduced into the hafnium silicate film to thereby change the hafnium silicate film into a nitrided hafnium silicate film as the fourth insulating film.

18. The semiconductor device manufacturing method according to claim 10, wherein
a zirconium silicate film is formed as the high-k insulating film, and
nitrogen is introduced into the zirconium silicate film to thereby change the zirconium silicate film into a nitrided zirconium silicate film as the fourth insulating film.

19. A semiconductor device manufacturing method comprising:
forming a mask material patterned into a predetermined shape on a semiconductor substrate;
etching the semiconductor substrate to a predetermined depth from a surface of the semiconductor substrate by using the mask material as a mask, thereby forming an element separation trench and a fin as well;
depositing a device isolation insulating film in the element separation trench and then removing the device isolation insulating film by using etching until it has a predetermined thickness and subsequently oxidizing a side surface of the fin by using a liquid oxidation agent without exposing this side surface to an atmosphere, thereby forming a first insulating film containing an oxide of a constituent element of the semiconductor substrate on the side surface of the fin;
forming a second insulating film containing an aluminum oxide on the first insulating film;

forming a third insulating film containing a rare earth oxide on the second insulating film;

forming a high-k insulating film containing at least one of hafnium and zirconium on the third insulating film;

introducing nitrogen into the high-k insulating film to thereby make the high-k insulating film a fourth insulating film; and subsequently conducting heat treatment to thereby stabilize the nitrogen in the fourth insulating film and also change the first, second and third insulating films into an insulating film made of a mixture containing aluminum, a rare earth element, the constituent element of the semiconductor substrate, and oxygen.

* * * * *